United States Patent
Sarin

(10) Patent No.: US 8,355,278 B2
(45) Date of Patent: *Jan. 15, 2013

(54) REDUCING EFFECTS OF PROGRAM DISTURB IN A MEMORY DEVICE

(75) Inventor: Vishal Sarin, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 467 days.

This patent is subject to a terminal disclaimer.

(21) Appl. No.: 12/756,584

(22) Filed: Apr. 8, 2010

(65) Prior Publication Data

US 2010/0188898 A1 Jul. 29, 2010

Related U.S. Application Data

(63) Continuation-in-part of application No. 12/619,862, filed on Nov. 17, 2009, now Pat. No. 7,995,400, which is a continuation of application No. 11/868,042, filed on Oct. 5, 2007, now Pat. No. 7,619,933.

(51) Int. Cl.
*G11C 11/34* (2006.01)

(52) U.S. Cl. ......... 365/185.02; 365/185.18; 365/185.19; 365/185.27

(58) Field of Classification Search ............. 365/185.02, 365/185.18, 185.19, 185.27
See application file for complete search history.

(56) References Cited

U.S. PATENT DOCUMENTS

| | | | |
|---|---|---|---|
| 5,295,106 A | 3/1994 | Jinbo | |
| 5,491,657 A | 2/1996 | Haddad et al. | |
| 5,661,683 A | 8/1997 | Song | |
| 5,715,194 A | 2/1998 | Hu | |
| 6,061,270 A | 5/2000 | Choi | |
| 6,477,088 B2 | 11/2002 | Ogura et al. | |
| 6,731,544 B2 | 5/2004 | Han et al. | |
| 6,747,899 B2 | 6/2004 | Hsia et al. | |
| 6,771,540 B2 * | 8/2004 | Satoh et al. | 365/185.18 |
| 6,807,104 B2 | 10/2004 | Arai et al. | |
| 6,956,770 B2 | 10/2005 | Khalid et al. | |
| 7,057,931 B2 | 6/2006 | Lutze et al. | |
| 7,139,198 B2 | 11/2006 | Guterman et al. | |
| 7,212,435 B2 | 5/2007 | Rudeck et al. | |
| 7,254,084 B2 | 8/2007 | Terasawa et al. | |
| 7,298,651 B2 | 11/2007 | Zhang | |
| 7,433,233 B2 | 10/2008 | Chen et al. | |
| 2001/0050442 A1 | 12/2001 | Lee | |
| 2002/0118569 A1 | 8/2002 | Jeong et al. | |
| 2004/0233725 A1 | 11/2004 | Iwase et al. | |
| 2005/0243602 A1 | 11/2005 | Umezawa | |
| 2005/0254309 A1 | 11/2005 | Kwon et al. | |
| 2007/0109870 A1 | 5/2007 | Kurata et al. | |

* cited by examiner

*Primary Examiner* — Hoai V Ho
*Assistant Examiner* — Pablo Huerta
(74) *Attorney, Agent, or Firm* — Leffert Jay & Polglaze, P.A.

(57) ABSTRACT

The programming disturb effects in a semiconductor non-volatile memory device can be mitigated by biasing unselected memory cells with a negative voltage while a well containing the memory cells receives a positive voltage. A selected memory cell in the well can be biased with a negative voltage while the well is at the positive voltage then the selected memory cell bias transitions to a positive programming voltage when the well returns to a ground potential.

29 Claims, 9 Drawing Sheets

REDUCING EFFECTS OF PROGRAM DISTURB IN A MEMORY DEVICE

RELATED APPLICATIONS

This application is a continuation-in-part of U.S. patent application Ser. No. 12/619,862 filed Nov. 17, 2009 now U.S. Pat. No. 7,995,400, which is a continuation application of Ser. No. 11/868,042, filed Oct. 5, 2007, now U.S. Pat. No. 7,619,933, which are commonly assigned and incorporated herein by reference in their entirety.

TECHNICAL FIELD

The present invention relates generally to memory devices and in particular the present invention relates to non-volatile memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile memory (e.g., flash memory).

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

FIG. 1 shows a portion of a typical prior art NAND flash memory array. The selected access line (e.g., word line) 100 for the flash memory cells being programmed is typically biased by programming pulses that start at a voltage of around 16V and may incrementally increase to more than 20V. The selected word line 100 of the cells 101-103 to be programmed is biased at 19V. The unselected word lines for the remaining cells are biased at a pass voltage $V_{pass}$. This is typically in an approximate range of 9-10V. The data lines (e.g., bit lines) of the cells 101-103 to be programmed are biased at 0V while the other bit lines are inhibited (i.e., biased at a supply voltage $V_{CC}$).

As NAND flash memory is scaled, parasitic capacitance coupling between the selected word line and adjacent word lines becomes problematic. Because of the parasitic coupling, the neighboring cells are more prone to program disturb than the other cells that also share the common bit line with the cells being programmed. This causes the cells on neighboring wordlines to experience program disturb.

The program disturb condition has two operation modes: boosting mode and $V_{pass}$ mode. During the boosting mode, the cell's channel is at a positive boosting voltage (e.g., 6V) with respect to the gate and the gate is at a program voltage $V_{pgm}$ (e.g., 19V). During the $V_{pass}$ mode, the cell's channel is at a ground potential and the gate is at $V_{pass}$ (e.g., 10V). In FIG. 1, the cells 120, 121 on the selected word line 100 and inhibited bit lines are influenced by boosting mode program disturb. The neighboring cells 110-118 that are coupled to the enabled bit lines experience $V_{pass}$ mode program disturb.

Increasing $V_{pass}$ to try to reduce the disturb condition can make the condition worse for some cells. For example, the source and drain regions of one uninhibited bit line of memory cells 103, 112, 115, and 118 are coupled to 0V due to the 0V program biasing on the bit line. If $V_{pass}$ is only 10V on the unselected word lines, the source and drain regions are coupled to 9V. However, if $V_{pass}$ was raised to a higher voltage (e.g., 15V), the source/drain regions would also be coupled up to a higher voltage, thus increasing the program disturb on that bit line.

Program disturb can also degrade as the number of program/erase cycles increase. As the quantity of program/erase cycles increase, the voltage difference between the programmed state and the erased state narrows. This makes the affected cells more susceptible to over-programming as the threshold voltage distributions narrow.

For the reasons stated above, and for other reasons stated below which will become apparent to those skilled in the art upon reading and understanding the present specification, there is a need in the art for a way to reduce the effects of program disturb in a memory device.

DETAILED DESCRIPTION

Figure 1:
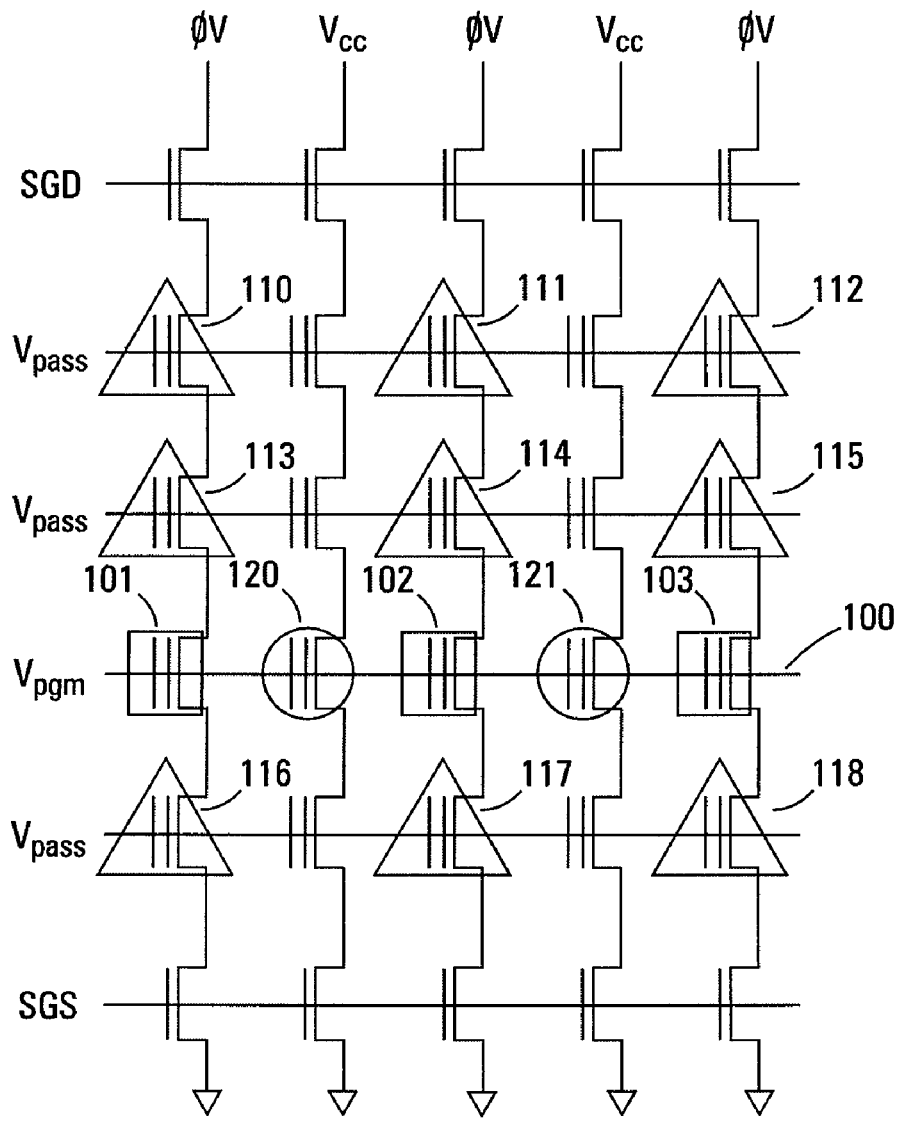
FIG. 1 shows a typical prior art NAND architecture memory array with word line biasing.

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

Figure 2:
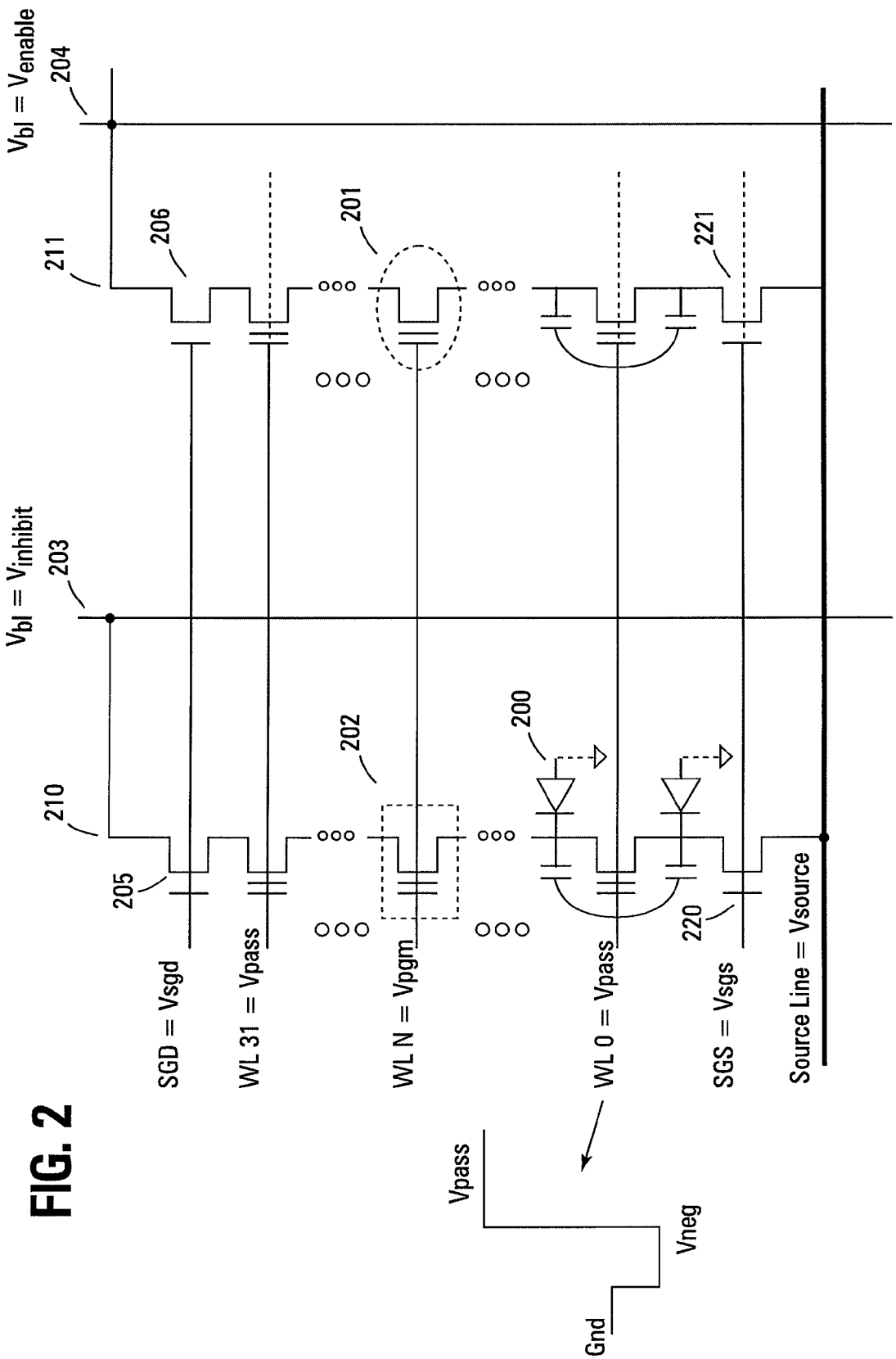
FIG. 2 shows a schematic diagram of a portion of a memory array of the present disclosure.

FIG. 2 illustrates a schematic of a portion of a memory array. This figure shows two series strings of memory cells 210, 211. Each series string 210, 211 is coupled to its respective data line (e.g., bit line) 203, 204 through a select gate drain transistor 205, 206. Each series string 210, 211 is also coupled to the source line through a select gate source transistor 220, 221. Each access line (e.g., word line) is coupled to the control gates of each memory cell in a row.

One bit line 203 is shown biased at an inhibit voltage (e.g., $V_{bl}=V_{CC}$). The other bit line 204 is shown biased at a program enable voltage (e.g., $V_{bl}=0V$). Thus, when word line N is biased at $V_{pgm}$ during a block program operation, the memory cell 202 of the series string 210 coupled to the inhibited bit line 203 will be protected from programming. The selected memory cell 201 of the series string 211 coupled to the enabled bit line 204 will be programmed.

In one embodiment, $V_{pgm}$ represents a series of incrementally increasing voltage pulses for programming the memory cells coupled to the enabled bit lines. The memory cells are programmed in groups blocks, after an erase operation has occurred, such that every other bit line is programmed and every other bit line is inhibited.

The programming operation is comprised of biasing the select gate source lines with a $V_{SGS}$ (e.g., 0V) that turns off the select gate source transistors. This turns off the series string discharge path through the select gate source transistors to the source line.

The $V_{bl}=V_{inhibit}$ (e.g., $V_{CC}$) is applied to the inhibited bit lines and $V_{SGD}$ (e.g., 0V) is applied to the select gate drain transistors such that the select gate drain transistors are turned off. This allows the inhibited series string source and drain nodes to eventually couple up to $V_{pass}$.

The bit lines to be programmed are biased at $V_{enable}$ (e.g., 0V) such that the source and drain of all cells in those series strings are discharged to ground and do not couple up with the high voltage on the gates. This induces programming of the selected memory cells when $V_{pgm}$ is provided to the selected word line $WL_N$.

The selected word line is then biased with the first programming pulse at an initial programming voltage (e.g., $V_{pgm}=16V$). A program verify operation is then performed to determine if all of the memory cells on the selected word line have been adequately programmed. If the verify discovers that a memory cell has not been programmed to the desired threshold voltage, the programming voltage is increased by a certain step voltage (e.g., 1V) and the selected word line is again biased with this voltage. This repeats until all of the cells of the selected word line have been either programmed or flagged as defective.

The unselected word lines of the memory block being programmed are biased at a $V_{pass}$ voltage that allows the unselected memory cells to act in a pass mode, i.e., these unselected memory cells are activated regardless of their stored data values. One embodiment of the method for programming seeks to mitigate program disturb by biasing these unselected word lines with a negative drive program inhibit scheme. As seen in FIG. 2, one such unselected memory cell 200 is coupled to word line 0 that is biased with a signal that initially goes negative (e.g., −4V) then ramps to a higher $V_{pass}$ level (e.g., 10V). The unselected memory cell 200 and the operation of one embodiment on the unselected memory cell 200 is illustrated in greater detail in FIG. 3.

Figure 3:
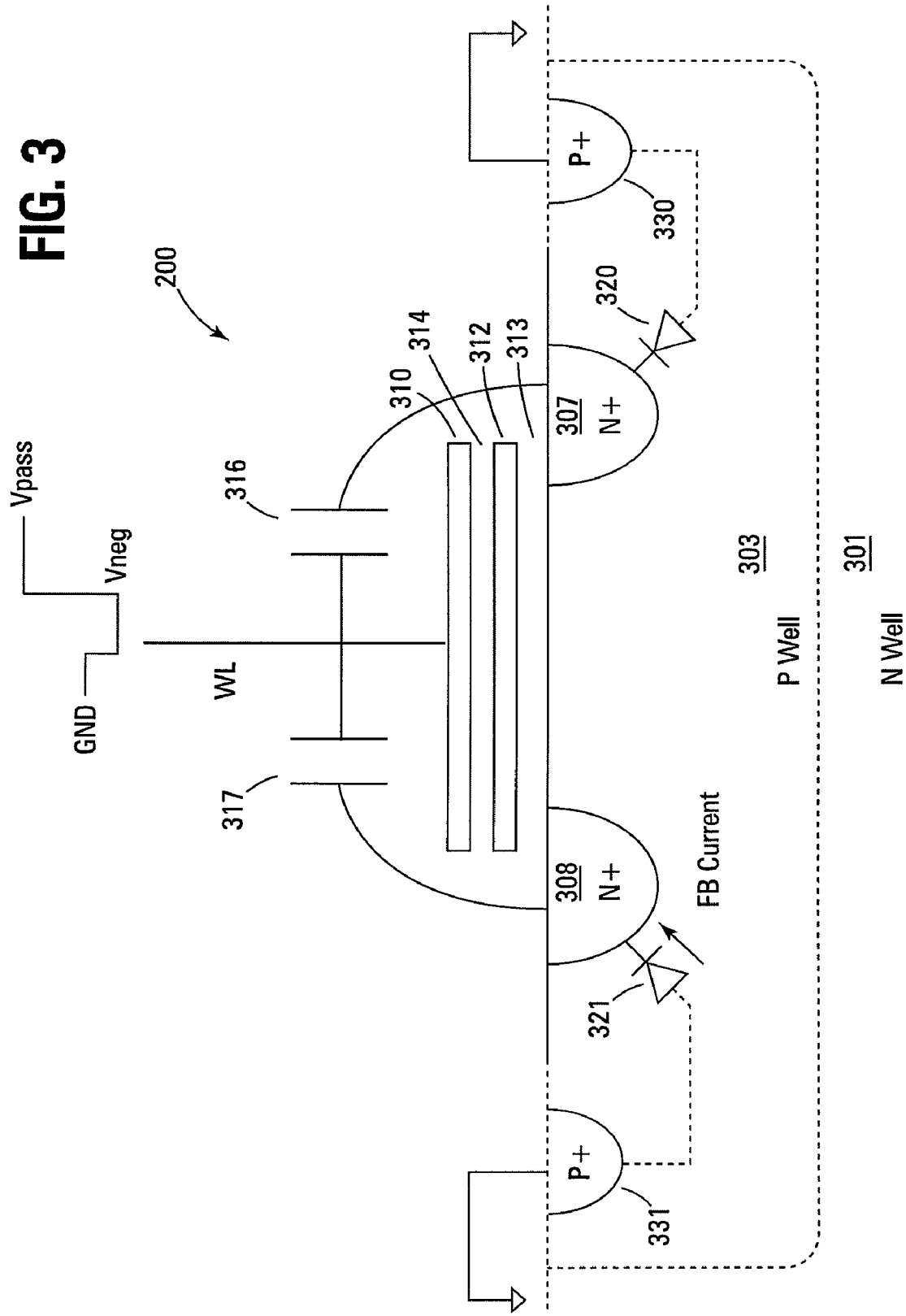
FIG. 3 shows a schematic and cross-sectional representation of one memory cell in accordance with the memory array of FIG. 2.

FIG. 3 illustrates a combination schematic and cross-sectional view of one unselected memory cell 200 of the array of FIG. 2. The illustrated embodiment is a floating gate transistor formed in a semiconductor in which an n-well 301 is formed. A p-well 303 is formed within the n-well 301. The memory array is contained within (e.g., formed within) the p-well. Alternate embodiments may reverse the conductivity and form the n-well within the p-well.

The transistor is comprised of a pair of source/drain regions 307, 308. The region 307 or 308 that functions as the drain and the region 308 or 307 that functions as the source depends on the biasing of these regions 307, 308.

The gate stack is comprised of a charge storage structure 312 that is typically referred to as the floating gate in many present conventional devices, but encompasses other structures, such as those often referred to as charge trap layers, for example. This structure 312 is isolated from the substrate by a tunnel dielectric 313 and is further isolated from a control gate 310 by a gate dielectric 314. Both dielectrics, in one embodiment, are oxides, e.g., silicon oxides.

The control gate 310 is coupled to each of the source/drain regions 307, 308 by an overlap capacitance 316, 317. The p-junctions at the n+ source/drain regions 307, 308 are represented by the diodes 320, 321 that regions 307, 308 form with the p-well. The diodes 320, 321 are shown coupled to the p-well taps 330, 331.

During a program operation, while the selected word line is biased at $V_{pgm}$, the unselected word lines are initially biased at a negative voltage $V_{neg}$. All of the unselected source/drain regions will try to go to $Cc^*V_{neg}$ due to coupling where Cc is the coupling ratio (i.e., if the gate voltage is changed by a certain amount, the drain and source voltage change by Cc*gate voltage change). However, the forward biased diodes 320, 321 only allow these regions to go to $-V_{fb}$ (e.g., −1.0V).

Subsequent to the initial negative bias, the unselected word lines are pulled up from the $V_{neg}$ bias to $V_{pass}$. This couples up the source/drain regions of the inhibited series strings to $Cc^*(V_{pass}+V_{neg}-V_{fb})$. This provides a voltage swing on the source/drain regions that can be larger than a normal prior art $Cc^*V_{pass}$ voltage. In practice, the coupling ratio varies depending on the bias condition of the memory device. However, for simplicity of explanation, a fixed coupling ratio is presented here.

In one example of operation, $V_{neg}$ is −4.0V and $V_{pass}$ is 10V. Due to the coupling effect, the source/drain regions should couple up to $Cc^*13V$ (i.e., $CC^*(V_{pass}+V_{neg}-V_{fb})$). This has the effect of raising $V_{pass}$ higher than 10V because the $V_{pass}$ swing, instead of being from 0V to 10V, is now a −4V to 10V (i.e., 14V swing). $V_{pass}$ swing can be made even larger by making $V_{neg}$ even more negative. For example, if $V_{neg}$ is −8V and $V_{pass}$ is 8V, this produces a 16V voltage swing making source/drain couple to $Cc^*(V_{pass}-V_{neg}-V_{fb})$ which equals $Cc^*15V$ where $V_{fb}$ is 1V. Thus, $V_{pass}$ can be reduced, thereby reducing disturb on the unselected cells of the selected bit line along the NAND string; while at the same time facilitating a reduction of the program disturb on unselected cells of the selected word line.

Figure 4:
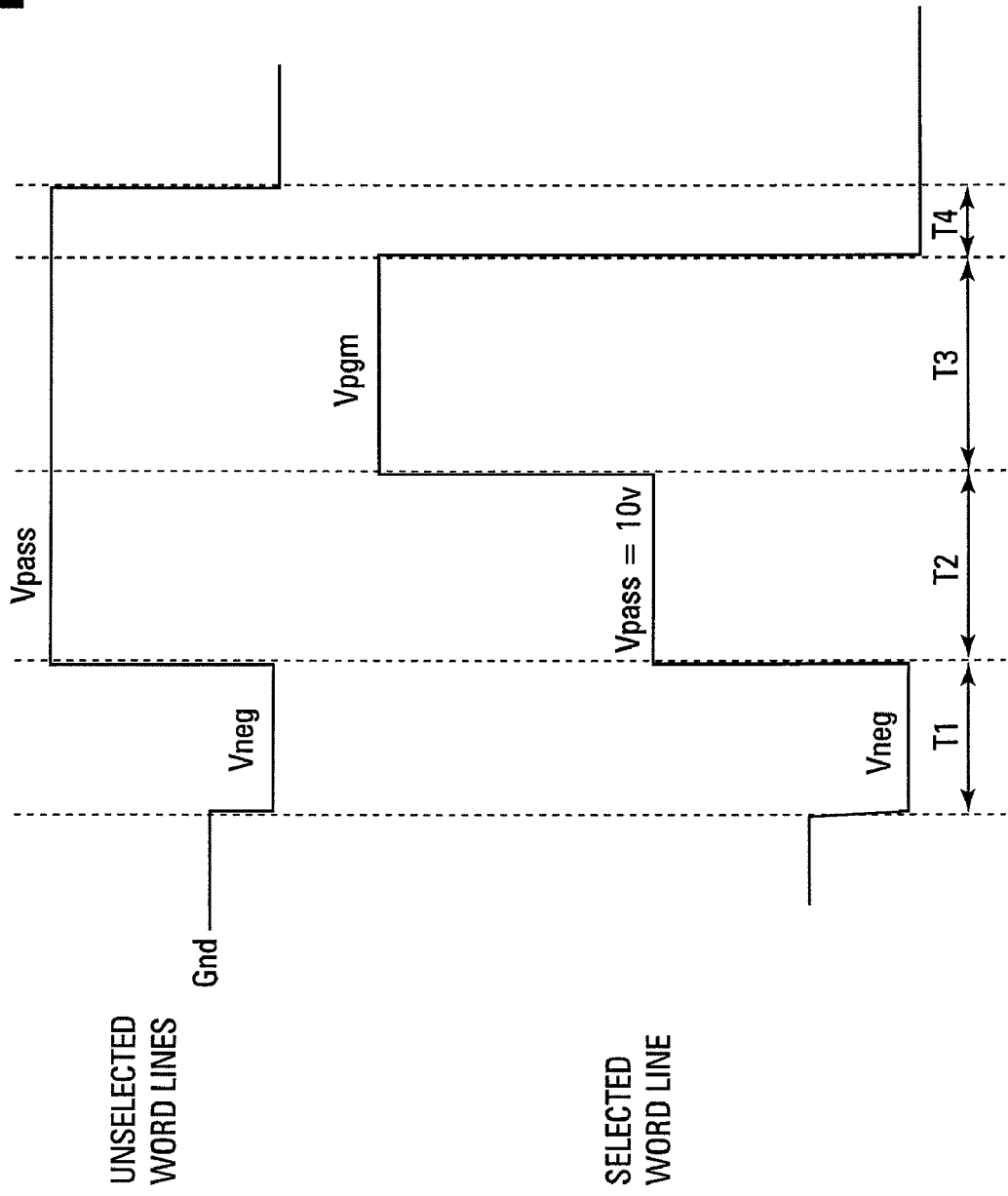
FIG. 4 shows a timing diagram of an alternate embodiment of the method for reducing the effects of program disturb in a memory device.

FIG. 4 illustrates a timing diagram of an alternate embodiment of the method for mitigating the effects of program disturb in a memory device. The top signal is the biasing of the unselected word lines as described in the previous embodiment. The biasing starts at ground, goes to $V_{neg}$ (e.g., −4.0V) then increases to $V_{pass}$ (e.g., 10V). The times T2 and T4 can be as close to 0 seconds as possible. This is true for both the previous embodiment and this alternate embodiment.

The lower signal is the biasing of the selected word line that is coupled to the memory cells to be programmed. In this embodiment, the biasing starts at $V_{neg}$ then transitions up to $V_{pgm}$. T3 can be any typical program time. If time T2 is greater than 0 seconds, the selected word line voltage can be at $V_{pass}$ (e.g., 10V) during time T2.

As in the previous embodiment, starting at a negative voltage provides a greater program voltage swing on the word line, thus providing a larger effective $V_{pgm}$. The select gate drain voltage ($V_{sgs}$), select gate source voltage ($V_{sgd}$), the source voltage ($V_{source}$), and the bit line voltage ($V_{bl}$) bias conditions can all be set so as to reduce gate induced drain leakage (GIDL).

Figure 5:
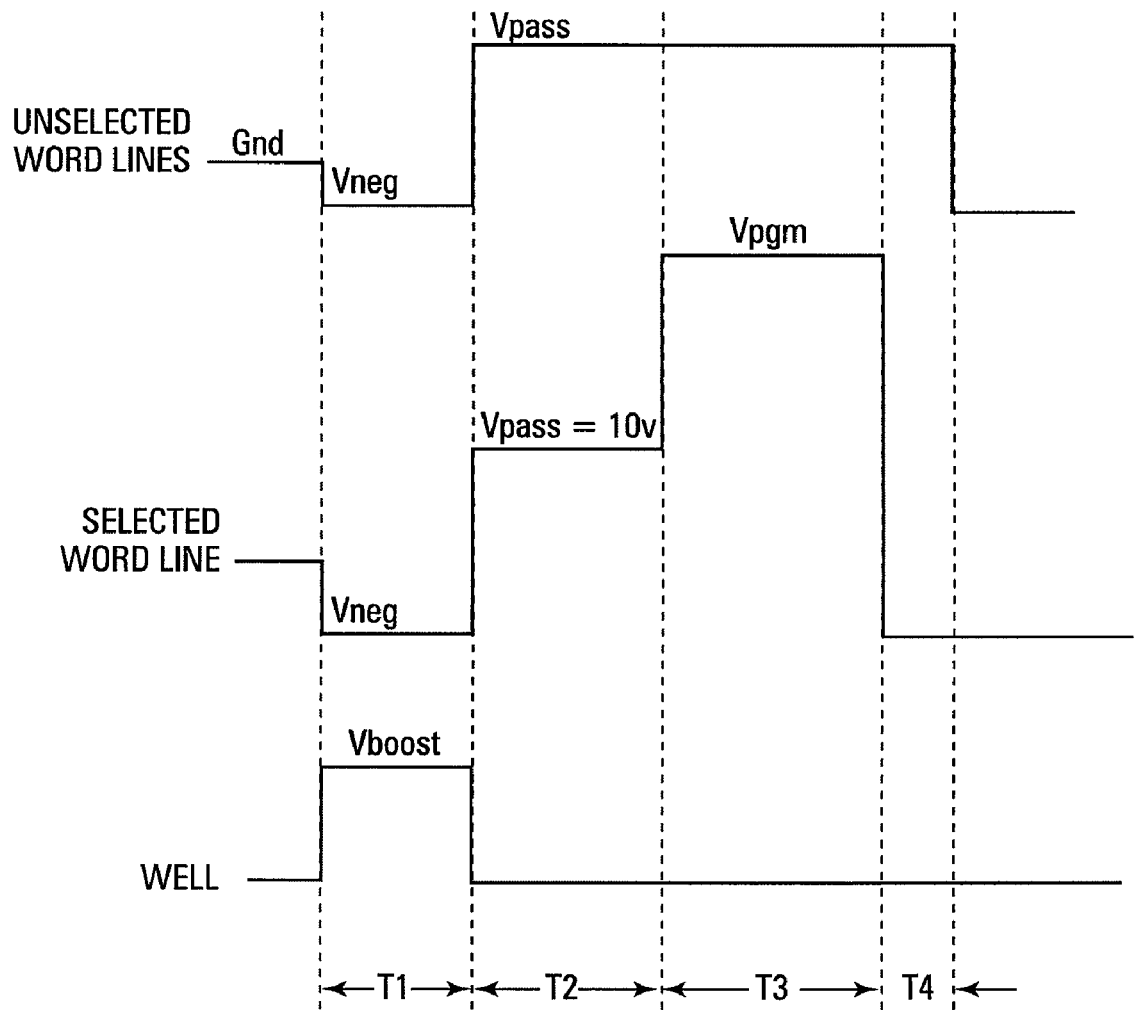
FIG. 5 shows a timing diagram of another embodiment of the method for reducing the effects of program disturb in a memory device.

FIG. 5 illustrates a timing diagram of another embodiment of the method for facilitating a reduction of the effects of program disturb in a memory device. The top signal is the biasing of the unselected word lines as described in the previous embodiment. The biasing goes to $V_{neg}$ (e.g., −4V) during time T1. At times T2 through T4, the unselected word lines are biased at $V_{pass}$ (e.g., 10V). The times T2 and T4 can be some very short time (e.g., as close to 0 seconds as possible).

The middle signal of FIG. 5 illustrates the biasing of the selected word line that is coupled to the memory cells to be programmed. In this embodiment, the biasing starts at $V_{neg}$ (e.g., −4V) then transitions to $V_{pgm}$ by time T3. If time T2 is greater than 0 seconds, the selected word line voltage can be at $V_{pass}$ (e.g., 10V) during time T2. After time T3, that can be any typical program time, the selected word line voltage returns to $V_{neg}$.

The lower signal of FIG. 5 illustrates the biasing of the p-well 303 that was illustrated in FIG. 3. During time T1, while the unselected word lines are biased at $V_{neg}$, the well is biased (e.g., pulled up) to a $V_{boost}$ voltage (e.g., 2V). This voltage on the well causes the source-to-drain voltage of the unselected memory cells to rise to $V_{boost}-V_{fb}$ by turning on the source/drain-to-p-well diodes 320, 321. When the $V_{boost}$ voltage is removed at time T2, the p-well voltage is coupled down by $V_{boost}*Cc$, thus leaving a residual voltage, $V_{sd}$, between the source and drain.

During time T2, when the unselected word lines are pulled from $V_{neg}$ to $V_{pass}$, the source and drains of the inhibited strings are coupled up to $Cc*(V_{pass}+|V_{neg}|)$ starting from the $V_{sd}$ residual voltage. Since $V_{pass}+|V_{neg}|>V_{pass}$, the inhibit voltage coupled to the source and drains of the inhibited strings is increased without increasing $V_{pass}$ and without further inducing $V_{pass}$ disturb.

Figure 6:
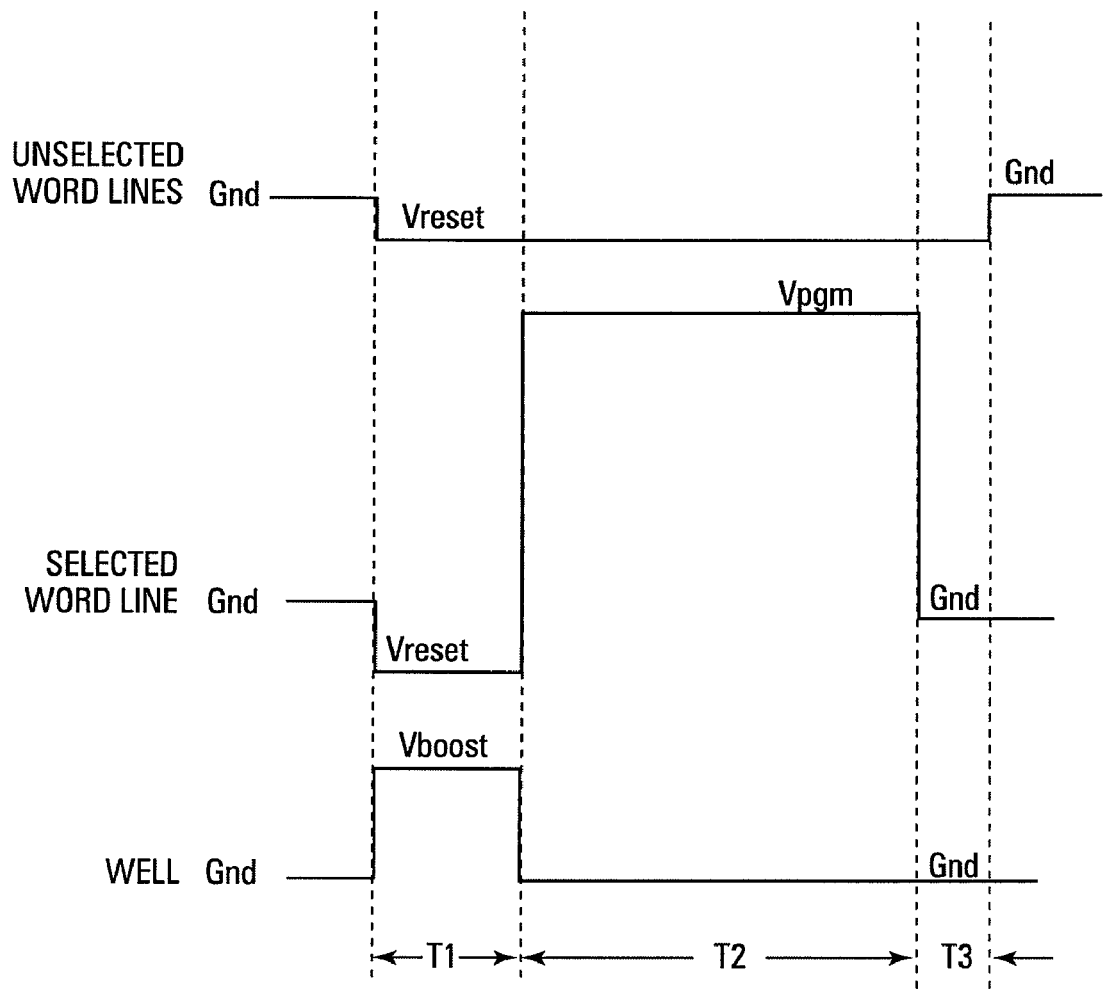
FIG. 6 shows a timing diagram of yet another embodiment of the method for reducing the effects of program disturb in a memory device.

FIG. 6 illustrates a timing diagram of yet another embodiment of the method for facilitating a reduction of the effects of program disturb in a memory device. This embodiment is similar to the embodiment of FIG. 5 in that a $V_{boost}$ voltage (e.g., 2V) is applied to the p-well during time T1. However, in this embodiment, the unselected and selected word line voltages begin at a negative voltage, $V_{reset}$.

$V_{reset}$ can be determined by memory device characterization during the manufacturing process. $V_{reset}$ will be discussed subsequently with reference to both FIGS. 6 and 7. In one embodiment, $V_{reset}$ can be between −3V and −4V.

It can be seen in FIG. 6 that during time T1, the unselected word lines and the selected word line are at $V_{reset}$ when the p-well is biased at $V_{boost}$. The unselected word lines remain at $V_{reset}$ throughout the programming operation of times T2 to T3. The selected word line is biased at $V_{pgm}$ during time T2 before returning to ground at time T3. The p-well voltage returns to ground at time T2 and remains there for T2 to T3.

Figure 7:
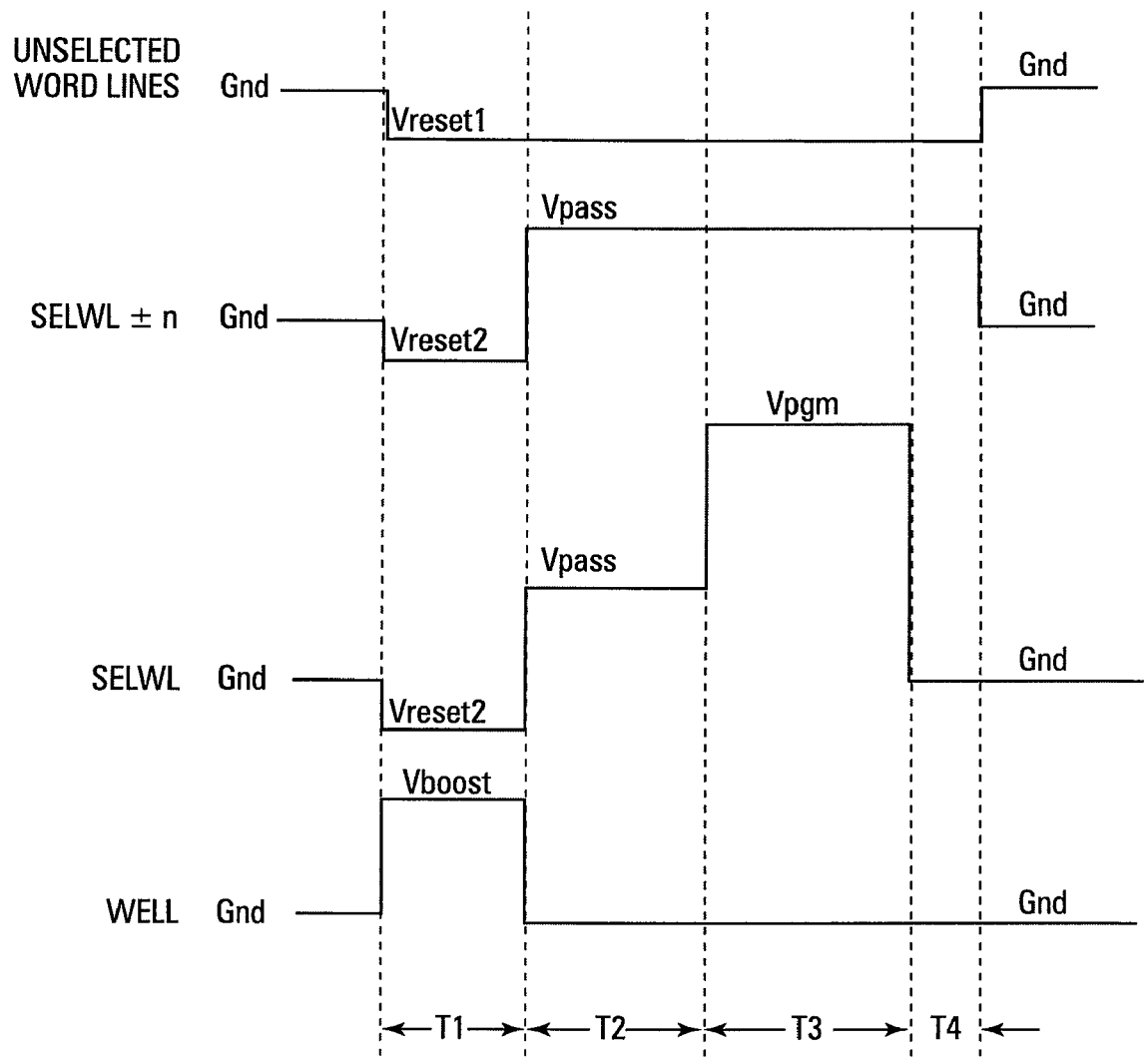
FIG. 7 shows a timing diagram of yet another embodiment of the method for reducing the effects of program disturb in a memory device.

FIG. 7 illustrates a timing diagram of yet another embodiment of the method for facilitating a reduction of the effects of program disturb in a memory device. This embodiment also uses the $V_{boost}$ voltage during time T1. However, this embodiment uses two $V_{reset}$ voltages, $V_{reset1}$ and $V_{reset2}$, that, in one embodiment, are different voltages. For example, $V_{reset1}$ might be −3V while $V_{reset2}$ might be −4V. As in the previous embodiment, the $V_{reset1}$ and $V_{reset2}$ voltages can be determined by device characteristics during manufacture.

Also in this embodiment, at least one unselected word line adjacent to the selected word line is biased differently from the remaining unselected word lines. The illustrated embodiment assumes that adjacent, unselected word lines on either side of the selected word line are biased differently than the remaining unselected word lines. An alternate embodiment might bias only one of these adjacent, unselected word lines in this manner. In yet another alternate embodiment, more than one unselected word line that is closest to the selected word line is biased differently. These word lines are subsequently referred to as SELWL±n.

Referring to FIG. 7, it can be seen that, during time T1, the p-well voltage is biased (e.g., pulled up to) $V_{boost}$ (e.g., 2V), the selected word line is biased at $V_{reset2}$ (e.g., −4V), the SELWL±n word lines are biased at $V_{reset2}$ (e.g., −4V), and the remaining unselected word lines are biased at $V_{reset1}$ (e.g., −3V).

The well voltage returns to ground during times T2 through T4. The selected word line transitions from $V_{reset2}$ to $V_{pgm}$ after time T1. If T2 is greater than 0 seconds, this voltage might be at $V_{pass}$ (e.g., 10V) during time T2. By time T3, the selected wordline is at $V_{pgm}$ and returns to ground at time T4. The SELWL±n word lines are at $V_{pass}$ (e.g., 10V) during times T2 through T4 before returning to ground after T4. The remaining unselected word lines are kept at $V_{reset1}$ during the programming operation (e.g., times T1 through T4).

The $V_{reset1}$ and $V_{reset2}$ voltages provide a local self boost that isolates the channel of the selected word line or, in the embodiment of FIG. 7, SELWL±n word lines, from the unselected word lines. This tends to prevent the unselected word line channels from being boosted by the programming pulse that is applied to the selected word line. By maintaining the selected word line (or SELWL±n word lines) at a negative voltage (e.g., $V_{reset1}$ and/or $V_{reset2}$) during the program pulse, memory cells associated with the unselected word lines are turned off and the path between the channels of the memory cells associated with the unselected word lines and the memory cells associated with the selected word line (or SELWL±n word lines) is disconnected. Thus, $V_{reset1}$ and $V_{reset2}$ are determined such that they can accomplish this disconnection. In one embodiment, $V_{reset2}$ might need a more negative voltage than $V_{reset1}$ in order to turn off the memory cells associated with the SELWL±n word lines that are closest to the selected word line.

Figure 8:
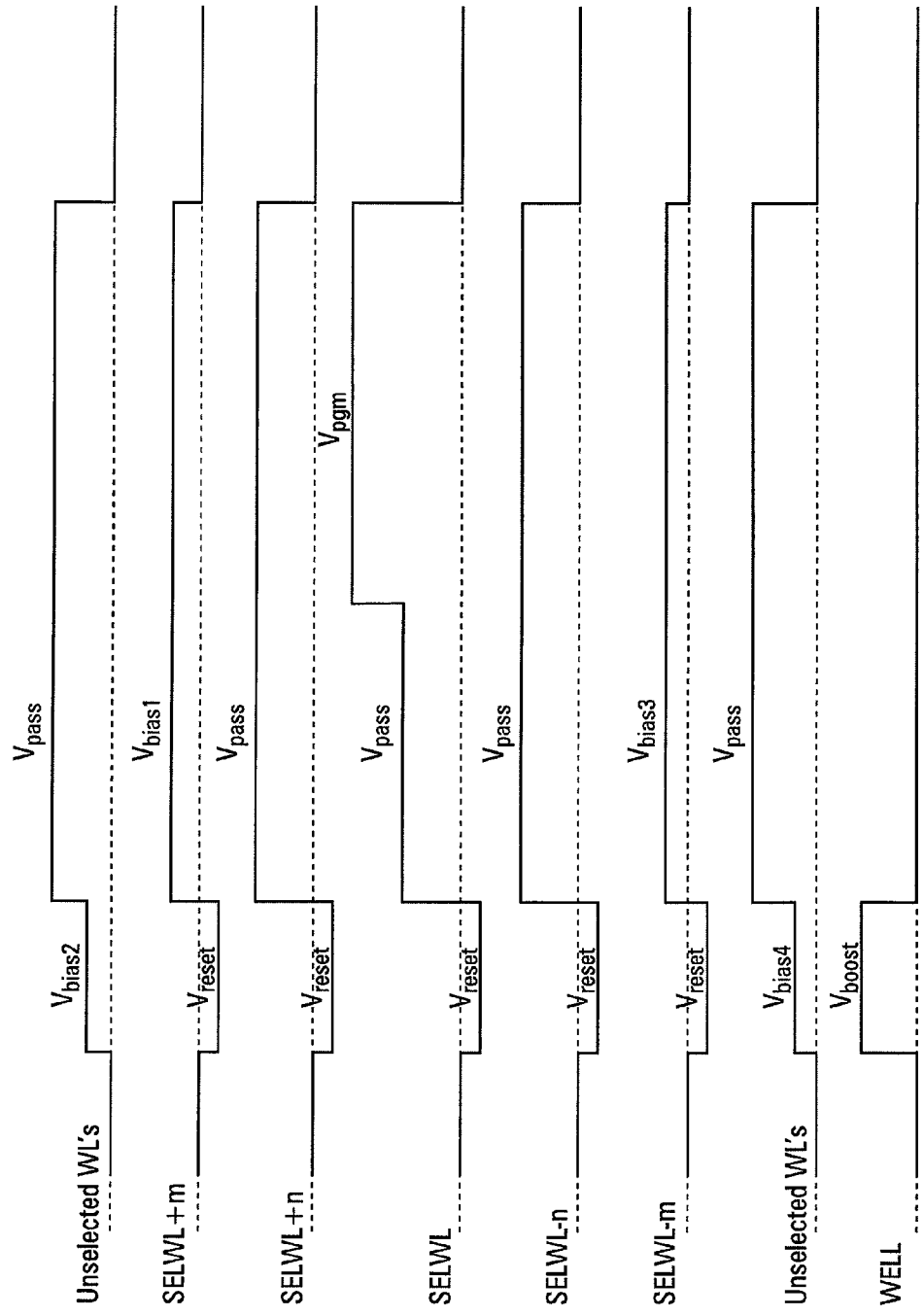
FIG. 8 shows a timing diagram of yet another embodiment of the method for reducing the effects of program disturb in a memory device.

FIG. 8 illustrates a timing diagram of another embodiment of the method for reducing the effects of program disturb in a memory device. This figure illustrates another embodiment for biasing of the unselected word lines during a programming operation. As shown in the middle waveform, as in previous embodiments, the selected word line (SELWL) is still biased at a negative voltage with respect to ground prior to eventually reaching a programming voltage $V_{pgm}$.

The remaining word lines of the group of memory cells (e.g., memory block) can then be biased at any combination of voltages and different groupings of unselected word lines, during the $V_{boost}$ of the well, that would cut off leakage from the boosted channels and avoid disturb. For example, FIG. 8 shows that, prior to going to $V_{pass}$, one set of unselected word lines on the drain side of SELWL is biased at a first voltage $V_{bias2}$ while the well is biased with $V_{boost}$. Another set of word lines on the source side of SELWL are biased at $V_{bias4}$ during the $V_{boost}$ time, prior to going to $V_{pass}$. $V_{bias2}$ can be substantially the same as $V_{bias4}$ or a different voltage. $V_{bias2}$ and $V_{bias4}$ are shown as being positive voltages with respect to ground. However, alternate embodiments can use negative voltages with respect to ground.

Also during the $V_{boost}$ time, unselected word lines that are +m distance (SELWL+m) from SELWL can be biased at $V_{reset}$ before being biased at $V_{bias3}$ while unselected word lines SELWL-m can be biased at $V_{reset}$ before being biased at $V_{bias3}$. $V_{bias1}$ may or may not be substantially the same as $V_{bias3}$.

Unselected word lines SELWL+n can be biased at $V_{reset}$ during the $V_{boost}$ time prior to being biased at $V_{pass}$ while unselected word lines SELWL-n can be biased at $V_{reset}$ prior to being biased at $V_{pass}$.

Figure 9:
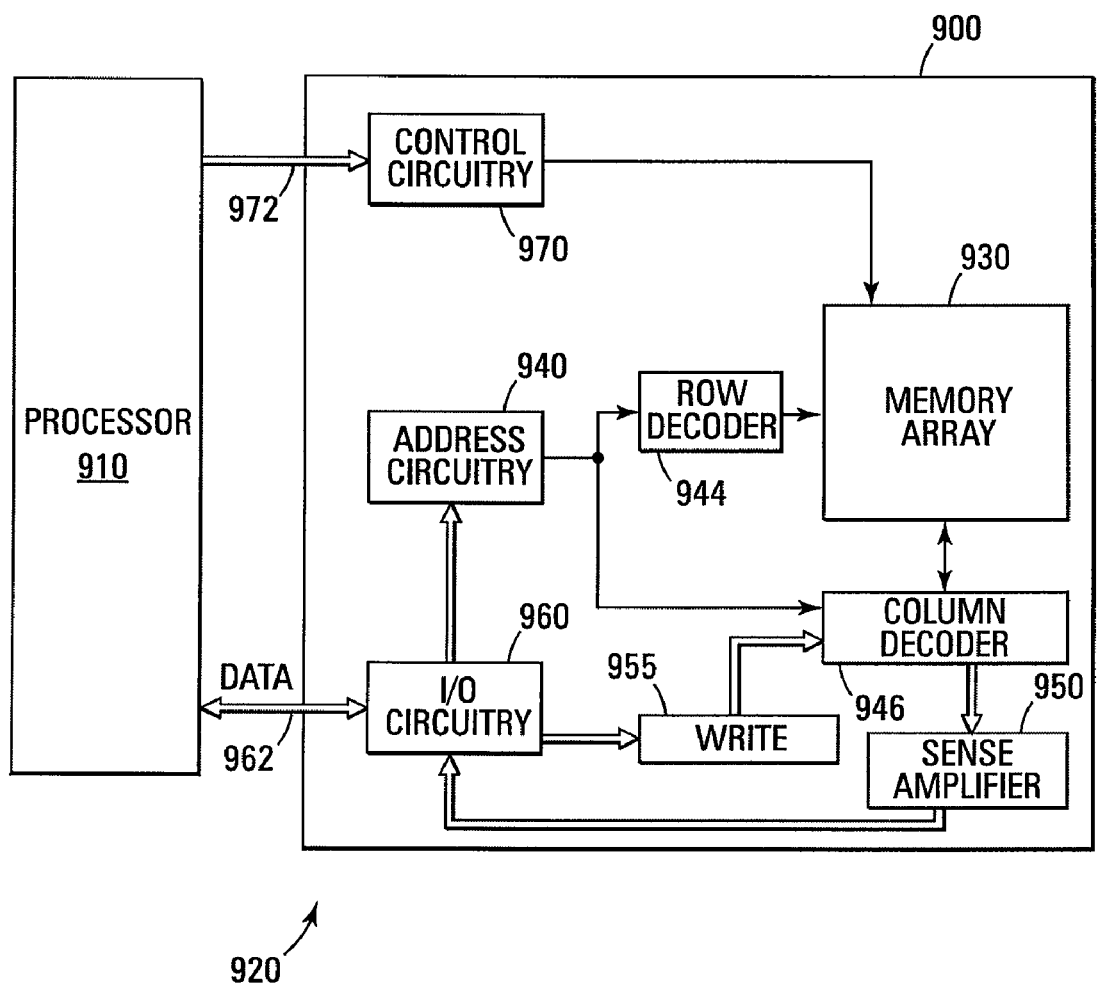
FIG. 9 shows a block diagram for one embodiment of a memory system of the present invention.

FIG. 9 illustrates a functional block diagram of a memory device 900. The memory device 900 is coupled to an external processor 910. The processor 910 may be a microprocessor or some other type of controller. The memory device 900 and the processor 910 form part of a memory system 920. The memory device 900 has been simplified to focus on features of the memory that are helpful in understanding the present invention.

The memory device 900 includes an array 930 of non-volatile memory cells, such as the one illustrated previously in FIG. 1. The memory array 930 is logically arranged in banks of word line rows and bit line columns. In one embodiment, the columns of the memory array 930 are comprised of series strings of memory cells. As is well known in the art, the connections of the cells to the bit lines determines whether the array is a NAND architecture, an AND architecture, or a NOR architecture.

Address buffer circuitry 940 is provided to latch address signals provided through I/O circuitry 960. Address signals are received and decoded by a row decoder 944 and a column decoder 946 to access the memory array 930.

The memory device 900 reads data in the memory array 930 by sensing voltage or current changes in the memory array columns using sense amplifier circuitry 950. The sense amplifier circuitry 950, in one embodiment, is coupled to read and latch a logical page of data from the memory array 930. Data input and output buffer circuitry 960 is included for bidirectional data communication as well as the address communication over a plurality of data connections 962 with the controller 910. Write circuitry 955 is provided to write data to the memory array.

Memory control circuitry 970 decodes signals provided on control connections 972 from the processor 910. These signals are used to control the operations on the memory array 930, including data read, data write (program), and erase operations. The memory control circuitry 970 (e.g., a state machine, a sequencer, or some other type of controller) generates the memory control signals. In one embodiment, the memory control circuitry 970 is configured to execute programming operations in accordance with embodiments described herein.

The flash memory device illustrated in FIG. 9 has been simplified to facilitate a basic understanding of the features of the memory. A more detailed understanding of internal circuitry and functions of flash memories are known to those skilled in the art.

CONCLUSION

In summary, one or more embodiments of the present disclosure seek to mitigate program disturb effects during a block program operation in a non-volatile memory device. For example, unselected word lines (and therefore the cells to which they are coupled) can be initially biased with a negative voltage prior to biasing with $V_{pass}$ while the well is biased with a positive voltage (e.g., 2V). This facilitates a larger voltage coupling effect on the source and drain of unselected word line cells thus facilitating a reduction of the program disturb.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a memory array, the method comprising:
   biasing control gates of selected memory cells with a bias sequence comprising an increasing programming voltage applied to the control gates of the selected memory cells wherein the programming voltage is preceded by a negative voltage during which a well containing the memory array is biased at a positive voltage wherein the negative voltage is negative with respect to a reference voltage and the positive voltage is positive with respect to the reference voltage.

2. The method of claim 1 and further comprising biasing control gates of unselected memory cells with the negative voltage.

3. The method of claim 2 wherein the negative voltage is determined in response to manufactured characteristics of the memory array such that the negative voltage isolates channels of the unselected memory cells from channels of the selected memory cells.

4. The method of claim 2 wherein the control gates of the unselected memory cells are biased with the negative voltage during a time period that the selected memory cells are biased with the negative voltage and subsequent programming voltage.

5. The method of claim 1 wherein the negative voltage comprises a first negative voltage and further comprising biasing control gates of unselected memory cells at a second negative voltage.

6. The method of claim 5 wherein the first negative voltage is greater than the second negative voltage.

7. The method of claim 1 wherein the negative voltage comprises a first negative voltage and further comprising:
   biasing control gates of only certain ones of unselected memory cells at the first negative voltage while control gates of the selected memory cells are biased at the first negative voltage; and
   biasing control gates of remaining unselected memory cells of the memory array at a second negative voltage.

8. The method of claim 7 and further comprising biasing control gates of the certain ones of the unselected memory cells at a positive voltage, that is less than a programming voltage, while biasing control gates of the selected memory cells with the programming voltage.

9. The method of claim 1 wherein biasing control gates of the selected memory cells includes transitioning between the negative voltage and the programming voltage such that a pass voltage is applied to the control gates of the selected memory cells for a certain time period.

10. The method of claim 1 and further including applying an inhibit voltage to series strings of memory cells not being programmed and an enable voltage to series strings of memory cells being programmed.

11. A method for programming a selected memory cell of a series string of memory cells, the method comprising:
- biasing a well containing the series string of memory cells with a first positive voltage relative to a reference voltage;
- biasing a control gate of at least one unselected memory cell of the series string of memory cells at a negative voltage, relative to the reference voltage, while biasing the well with the first positive voltage;
- biasing the well with the reference voltage after biasing the well with the first positive voltage; and
- biasing a control gate of the selected memory cell with a second positive voltage while biasing the well with the reference voltage.

12. The method of claim 11 wherein biasing the well with the first positive voltage occurs only while biasing the control gates of the at least one unselected memory cells with the negative voltage.

13. The method of claim 12 wherein the well is at the reference voltage prior to the first positive voltage.

14. The method of claim 11 wherein the negative voltage comprises a first negative voltage and further including biasing the control gate of the selected memory cell with a second negative voltage prior to the second positive voltage.

15. The method of claim 14 wherein biasing the selected memory cell with the second negative voltage occurs only during a time period when the control gates of the at least one unselected memory cells are biased at the first negative voltage and the well is biased at the first positive voltage.

16. The method of claim 14 wherein the first and second negative voltages are substantially equal.

17. A memory device, comprising:
- a memory array having a plurality of memory cells formed in a semiconductor well; and
  - memory control circuitry, coupled to the memory array, for controlling operation of the memory device, wherein the memory control circuitry is configured, during a programming sequence, to control a bias on a selected memory cell with a negative voltage, with respect to a reference voltage, and subsequently bias the selected memory cell with a positive programming voltage, with respect to the reference voltage, the memory control circuitry is further configured to control a bias of the semiconductor well at a positive voltage while the selected memory cell is biased at the negative voltage.

18. The memory device of claim 17 wherein the memory control circuitry is further configured to control a bias of certain unselected memory cells adjacent to the selected memory cell such that the certain unselected memory cells are biased at the negative voltage while the selected memory cell is biased at the negative voltage.

19. The memory device of claim 18 wherein the memory control circuitry is further configured to control bias of the certain unselected memory cells such that the certain unselected memory cells are biased at a positive pass voltage while the selected memory cell is biased at the positive programming voltage.

20. The memory device of claim 18 wherein the certain unselected memory cells comprise a plurality of unselected memory cells on both sides of the selected memory cell in the memory array.

21. The memory device of claim 19 wherein the memory control circuitry is further configured to control bias of the selected memory cell such that the selected memory cell is biased at the positive pass voltage for a certain time period between the first negative voltage and the positive programming voltage.

22. The memory device of claim 18 wherein the negative voltage comprises a first negative voltage and the memory control circuitry is further configured to control bias of remaining unselected memory cells of the memory array such that the remaining unselected memory cells are biased at a second negative voltage.

23. The memory device of claim 22 wherein the second negative voltage is less than the first negative voltage.

24. The memory device of claim 22 wherein the memory control circuitry is further configured to control bias of the remaining unselected memory cells such that the remaining unselected memory cells remain at the second negative voltage while the certain unselected memory cells are biased at the first negative voltage and the subsequent positive pass voltage.

25. The memory device of claim 18 wherein the memory control circuitry is further configured to control bias of the selected memory cell and the certain unselected memory cells such that the bias returns to ground potential after the programming bias sequence.

26. A method for programming a selected memory cell of a series string of memory cells, the method comprising:
- biasing a well containing the series string of memory cells at a first positive voltage relative to a reference voltage;
- biasing a control gate of the selected memory cell at a negative voltage, relative to the reference voltage, while biasing the well at the first positive voltage;
- biasing control gates of a plurality of sets of unselected memory cells such that each set of unselected memory cells is biased at a different voltage, while biasing the well at the first positive voltage;
- biasing the well at the reference voltage subsequent to biasing the well at the first positive voltage; and
- biasing the control gate of the selected memory cell at a second positive voltage while biasing the well at the reference voltage.

27. The method of claim 26 wherein each of the plurality of sets of unselected memory cells is a different distance from the selected memory cell in the series string of memory cells such that the different voltage biasing the control gates of each set of unselected memory cells is determined by the distance from the selected memory cell.

28. The method of claim 27 wherein the different voltage biasing the control gates of each set of unselected memory cells is determined by whether the set of unselected memory cells being biased is on a drain side or a source side of the selected memory cell.

29. The method of claim 27 wherein at least one set of unselected memory cells is biased at a positive voltage while the well is biased at the first positive voltage.

* * * * *